(12) United States Patent
Kamijima

(10) Patent No.: US 6,414,366 B1
(45) Date of Patent: *Jul. 2, 2002

(54) THIN-FILM MAGNETIC HEAD WAFER AND MANUFACTURING METHOD OF THIN-FILM MAGNETIC HEAD

(75) Inventor: Akifumi Kamijima, Tokyo (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/362,063

(22) Filed: Jul. 28, 1999

(30) Foreign Application Priority Data

Jul. 29, 1998 (JP) ............................................. 10-227541

(51) Int. Cl.⁷ ........................... H01L 21/66; H01L 27/01
(52) U.S. Cl. ........................ 257/421; 257/797; 356/123
(58) Field of Search .................................. 257/797, 421; 356/123

(56) References Cited

U.S. PATENT DOCUMENTS

| | | | | |
|---|---|---|---|---|
| 4,893,926 A | * | 1/1990 | Willis | |
| 5,986,858 A | * | 11/1999 | Sato et al. | |
| 5,990,567 A | * | 11/1999 | Tseng et al. | |
| 6,153,941 A | * | 11/2000 | Maejima | |

* cited by examiner

*Primary Examiner*—George Fourson
*Assistant Examiner*—Michelle Estrada
(74) *Attorney, Agent, or Firm*—Arent Fox Kintner Plotkin & Kahn, PLLC

(57) ABSTRACT

A thin-film magnetic head wafer with a surface to be exposed by means of an optical stepper includes a plurality of thin-film magnetic head elements formed on the surface, and distance check regions that are flat in level and horizontal to the surface of the wafer, at least one of the distance check regions being formed on the surface within one exposure area of the optical stepper.

2 Claims, 5 Drawing Sheets

THIN-FILM MAGNETIC HEAD WAFER AND MANUFACTURING METHOD OF THIN-FILM MAGNETIC HEAD

FIELD OF THE INVENTION

The present invention relates to a thin-film magnetic head wafer on which a plurality of thin-film magnetic head elements for magnetically recording into and/or reproducing from a magnetic medium such as a hard disk or a floppy disc are formed. The present invention also relates to a manufacturing method of a thin-film magnetic head.

DESCRIPTION OF THE RELATED ART

In general, when fabricating thin-film magnetic heads, various wafer processes for forming many thin-film head elements on a wafer in matrix are executed. Such wafer processes contain without exception a plurality of light exposure steps that typically use an optical stepper.

When performing a light exposure step using an optical stepper, it is necessary to confirm before each exposing operation that a position of focus of an optical system in this stepper is correctly located on an image surface or image plane of the wafer and that the image plane of the wafer is horizontal to the stepper. In order to perform these focus check and leveling check, detection of distance between the stepper and the image plane of the wafer will be required.

Since each magnetic head element formed on the thin-film magnetic head wafer is very tall, there are higher differences on the surface of the magnetic head wafer than on the surface of a semiconductor wafer. In most cases, these high differences are located even in regions used for focus check and leveling check. Therefore, the focus and the leveling will be checked based upon an average level or height of several magnetic head elements. The level of the head elements formed on not only one wafer but also wafers fabricated in different lots may vary. Thus, accuracy of the focus check and the leveling check may lower, and size and shape of resist patterns formed by using the stepper may become unstable causing yields to reduce.

It should be noted that no consideration has been taken before for accurately executing focus check and leveling check when performing a light exposure with respect to a thin-film magnetic head wafer.

SUMMARY OF THE INVENTION

It is therefore an object of the present invention to provide a thin-film magnetic head wafer and a manufacturing method of a thin-film magnetic head, whereby continued accuracy in focus check and leveling check in case of an exposure process can be assured.

According to the present invention, a thin-film magnetic head wafer with a surface to be exposed by means of an optical stepper includes a plurality of thin-film magnetic head elements formed on the surface, and distance check regions that are flat in level and horizontal to the surface of the wafer, at least one of the distance check regions being formed on the surface within one exposure area of the optical stepper.

At least one of distance check regions is formed on the surface of the wafer within one exposure area of the optical stepper, and the distance check region is kept flat and horizontal to the surface of the wafer. Thus, high accuracy of the focus check and the leveling check can be maintained. As a result, size and shape of resist patterns formed by using the stepper can be kept stable resulting yields to increase.

It is preferred that the distance check regions include a region for checking focus of the optical stepper with respect to the wafer.

It is also preferred that the region for checking focus is formed only one within one exposure area of the optical stepper and/or that the region for checking focus is formed at center portion of the one exposure area of the optical stepper.

It is preferred furthermore that the distance check regions include regions for checking leveling of the wafer with respect to the optical stepper.

It is also preferred that the plurality of regions for checking leveling are formed within one exposure area of the optical stepper, and/or that the regions for checking leveling are formed at bordering portions in the one exposure area of the optical stepper.

Preferably, the regions for checking leveling are formed to be split across a boundary between the exposure area and an adjacent exposure area of the optical stepper.

It is preferred that the distance check regions have surfaces with a level equal to that of a reference surface of the wafer, or that the distance check regions have surfaces with a level equal to that of a thin-film layer or thin-film layers deposited on the reference surface of the wafer.

According to the present invention, furthermore, a manufacturing method of thin-film magnetic heads on a wafer with a surface to be exposed by means of an optical stepper, includes a step of forming distance check regions that are flat in level and horizontal to the surface of the wafer, at least one of the distance check regions being formed on the surface within one exposure area of the optical stepper, and a step of checking a distance between the optical stepper and the surface to be exposed by using at least one of the formed distance check regions.

It is preferred that the checking step includes a step of checking focus of the optical stepper with respect to the surface of the wafer by using one of the formed distance check regions, and/or that the checking step includes a step of checking leveling of the surface of the wafer with respect to the optical stepper by using of the formed distance check regions.

It is also preferred that the forming step includes a step of inhibiting formation of thin-film layer on the distance check regions so that the distance check regions have surfaces with a level equal to that of a reference surface of the wafer, or that the forming step includes a step of depositing a flat thin-film layer or flat thin-film layers on the distance check regions so that the distance check regions have surfaces with a level equal to that of a thin-film layer or thin-film layers deposited on the reference surface of the wafer.

Further objects and advantages of the present invention will be apparent from the following description of the preferred embodiments of the invention as illustrated in the accompanying drawings.

DESCRIPTION OF THE PREFERRED EMBODIMENTS

Figure 1:
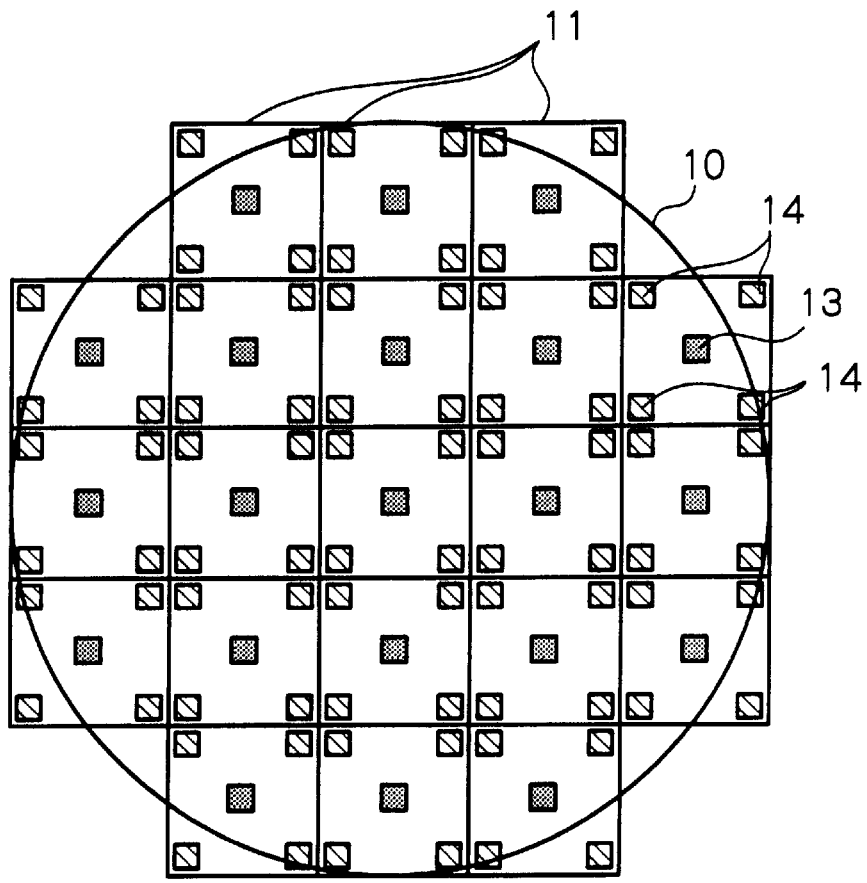
FIG. 1 shows a plane view schematically illustrating a thin-film magnetic head wafer, exposure area each of which corresponds to one exposure of an optical stepper, focus check regions and leveling check regions of a preferred embodiment according to the present invention.
Figure 2:
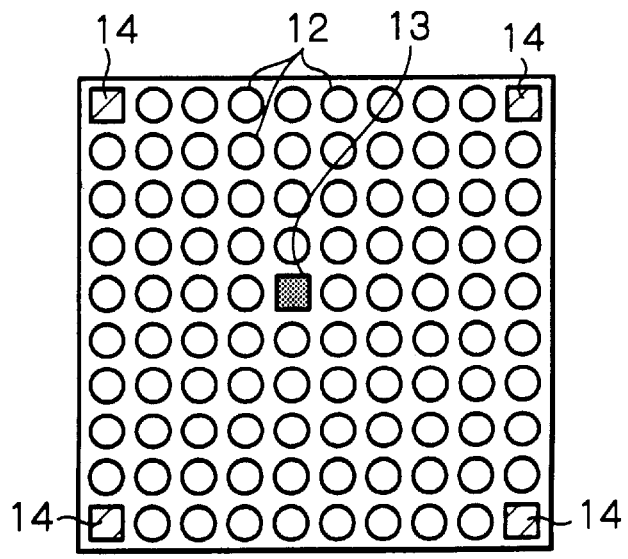
FIG. 2 shows a plane view illustrating in detail the area in one exposure, the focus check region and the leveling check regions according to the embodiment shown in FIG. 1.

In FIG. 1, reference numeral 10 denotes a thin-film magnetic head wafer for forming many thin-film head elements thereon in matrix. In each of exposure steps that are performed several times during each thin-film fabrication process of the wafer, an optical stepper sequentially exposes a plurality of exposure areas 11. In each exposure area 11 used for one exposing operation of the stepper, a pattern of many thin-film magnetic head elements 12 is exposed as shown in FIG. 2.

In each exposure area 11 on the wafer 10, furthermore, a region used for checking focus position (in this specification this region is called as focus check region) 13 and regions for checking leveling (in this specification these regions are called as leveling check regions) 14 are prepared. Preferably, a single focus check region 13 may be prepared at center portion of the exposure area 11 as shown in FIG. 2. Four leveling check regions 14 may be prepared at four corners of the exposure area 11, respectively. The number and position of these focus check region 13 and leveling check regions 14 are not limited to this. For example, two leveling check regions 14 may be prepared at diagonally opposite positions in the exposure area 11.

In the focus check region 13 and also in the leveling check regions 14, no element is formed. The surfaces within the focus check region 13 and the leveling check regions 14 are kept flat and horizontal to the surface of the wafer 10. Namely, when fabricating the thin-film layers on the wafer 10, no layer is deposited within the focus check region 13 and the leveling check regions 14 so that their surfaces have a plane level equal to a reference surface of the wafer 10. Alternately, each of multi-layers to be sequentially deposited in accordance with the fabricating processes of the thin-film magnetic head elements is deposited in flat on the wafer reference surface in the focus check region 13 and the leveling check regions 14 so as to represent level of the layers at each fabricating process. According to the latter case, since the level at the focus check region 13 and the leveling check regions 14 represents the level of the laminated layers at that time, deviations of the focus due to variations in the thickness of the deposited layers within a wafer or between lots of wafers can be automatically compensated. The leveling check regions 14 within each exposure area 11 should be formed to have the same level with each other.

The focus check region 13 and the leveling check regions 14 may be formed in a rectangular shape with a size of 0.3–2.0 mm×0.3–2.0 mm, a circular shape with a diameter of 0.3–2.0 mm or an ellipse shape with a diameter of 0.3–2.0 mm×0.3–2.0 mm. However, their shape is not limited to these shapes. The size of the regions 13 and 14 is also not limited to the above-mentioned sizes but will be determined so that the major portion, for example 80%, of beam used for focus check and for leveling check is applied within each region.

Figure 3:
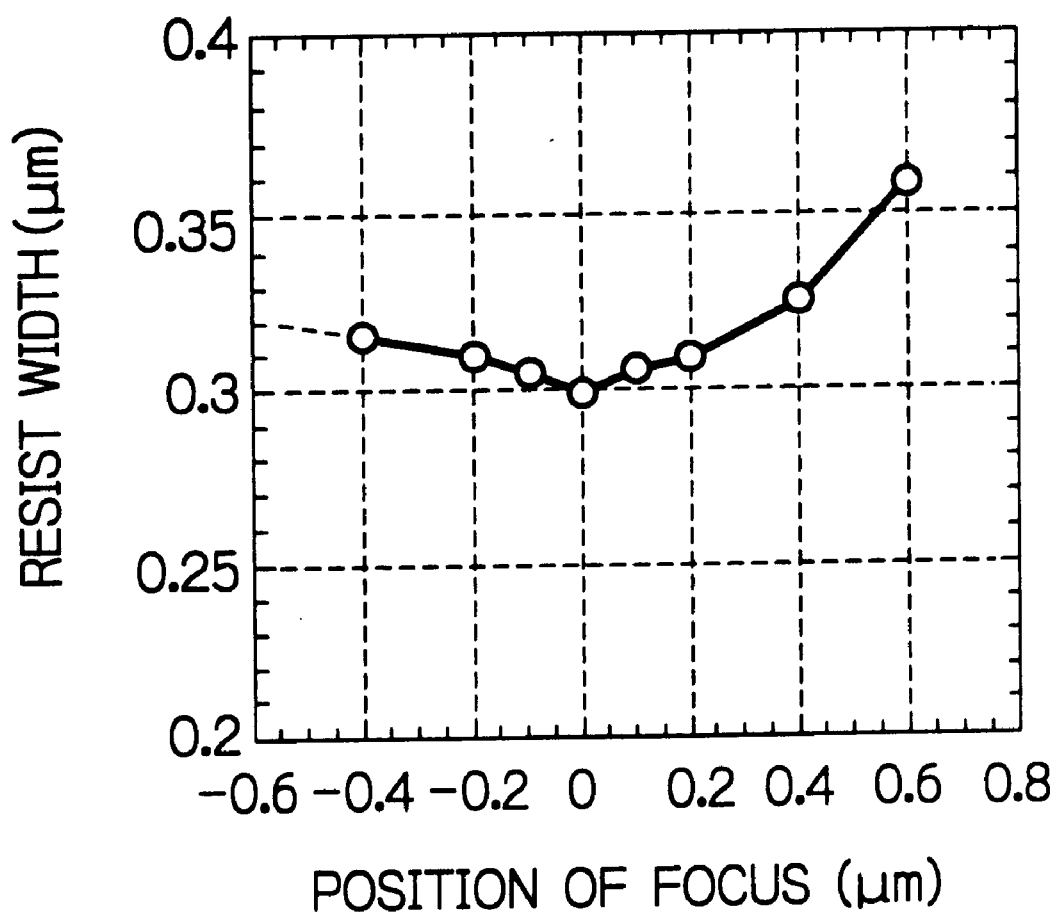
FIG. 3 illustrates a relationship between a position of focus and an obtained resist width in a resist exposure step when forming a critical layer.

There are several processes for forming "critical layers" in the fabricating process of the thin-film magnetic heads. The "critical layers" means layers with very narrow patterns that must form with high accuracy. FIG. 3 is a graph illustrating a relationship between a position of focus and an obtained resist width in a resist exposure step. This relationship is based upon a resist material used in one of the processes for forming the critical layers and upon conditions for printing the resist material. In the graph, a focus position of 0 ($\mu$m) indicates that the focus of the stepper is correct.

In general, such critical layer forming process is required to keep the printing precision of the resist material within a range of about ±10%. Therefore, in case that a target resist width is 0.3 $\mu$m, the resist pattern must be formed with a resist width within a range of 0.3±0.03 $\mu$m.

As shown in the graph of FIG. 3, no resist pattern can be formed when the focus position is less than −0.4 mm, and there is tendency to increase the obtained resist width when the focus position is 0.6 $\mu$m or more. Therefore, it is necessary to contain the focus accuracy within a range of ±0.4 $\mu$m in order to obtain the above-mentioned precision of the resist width. To obtain more improved resist width precision, it is desired that the focus accuracy is controlled within a range of ±0.2 $\mu$m.

It is apparent that the similar focus accuracy as shown in FIG. 3 will be required in the remaining processes for forming the critical layers.

If there is a difference in level on the surface in the focus check region 13 exerted on the checking of the focus and if portion other than the difference portion has a reference level with a level or height of zero, the detected focus position will depend on the product of a level or height of the difference portion and a ratio of an area of the difference portion with respect to an area of the whole region. Suppose that the ratio of the difference portion area with respect to the whole region area is 50%. In this case, to obtain the aforementioned resist width accuracy, the height of the difference in level should be limited to 0.8 $\mu$m or less, preferably to 0.4 $\mu$m or less.

Typically, the beam spot used for the focus check has a size of about 0.2 mm×1.0 mm. If the surface of such beam spot area used for the focus check is uniformly inclined to the stepper, it is possible to check whether the focus is correct or not based upon an average value of the distances between the inclined surface and the stepper. However, if the surface inclines too much, the reflected beam never return to a light sensor and thus no check of the focus is possible anymore. Therefore, the inclination of the surface of the focus check region 13 that is the region for measuring distance to check the focus is preferably limited to 5 or less with respect to the wafer surface.

The aforementioned ranges of difference in level and inclination of the surface of the focus check region 13 are similarly adapted to the ranges of difference in level and inclination of the surface of the leveling check regions 14.

Figure 4:
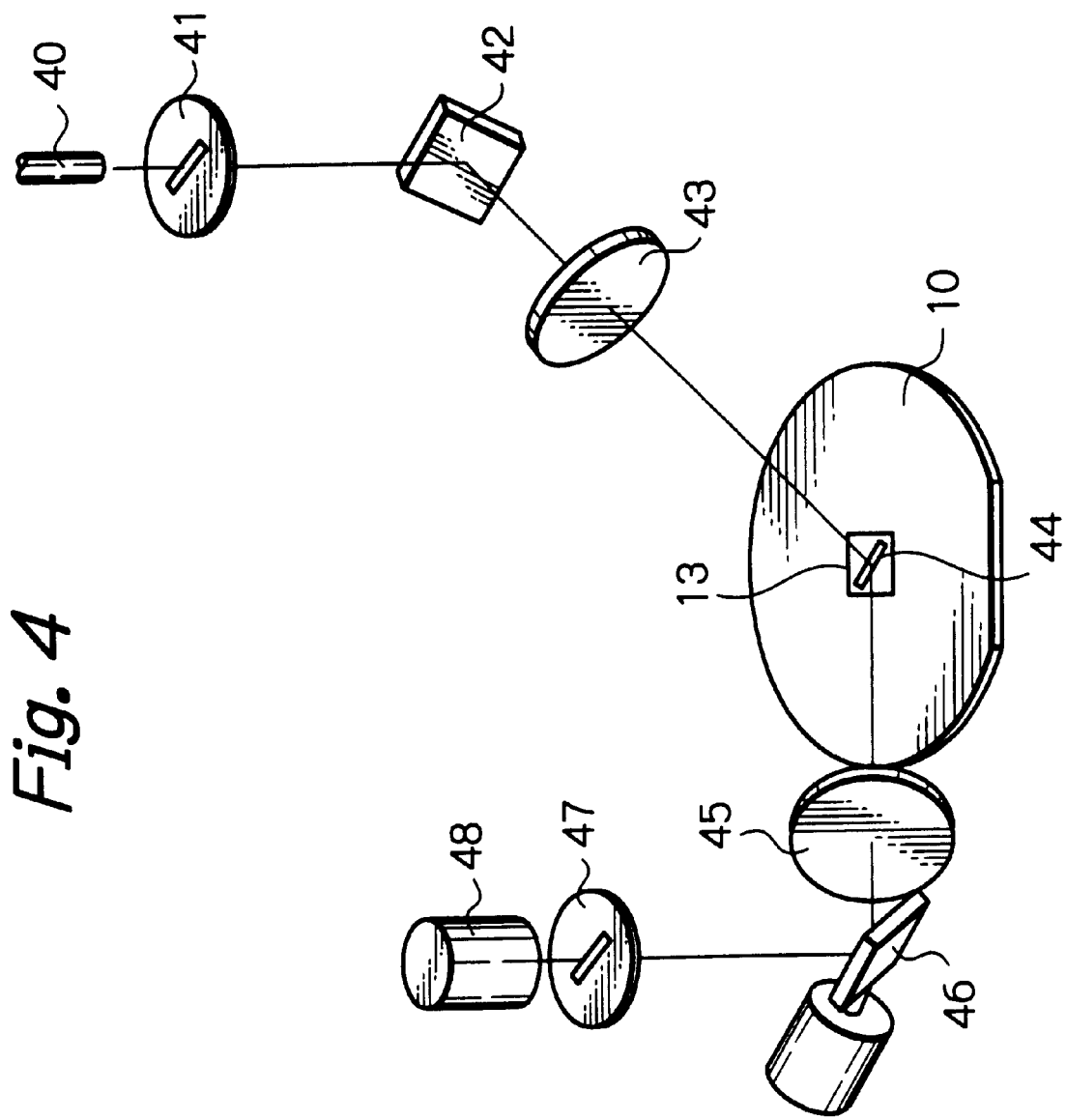
FIG. 4 illustrates configuration of an example of an optical system for the focus check and the leveling check.

FIG. 4 illustrates configuration of an example of an optical system for checking the focus and the leveling using such focus check region 13 and leveling check regions 14.

In the figure, reference numeral 40 denotes an optical fiber for transmitting light from a light source such as a mercury lamp (not shown), 41 a light transmitting slit, 42 a fixed mirror, 43 a projection lens, 44 a slit image projected on the wafer 10, 45 a condenser lens, 46 a rotational oscillation mirror, 47 a light receiving slit and 48 a light sensor.

In order to check the focus, the slit image 44 is projected and formed onto the focus check region 13 in the exposure area 11 on the wafer 10, and then it is checked whether a reflected slit light from the focus check region 13 through the light receiving slit 47 can be detected by the light sensor 48 or not. If the surface of the wafer 10 locates at the correct focus position, the reflected slit light can be detected. Otherwise, no slit light can be detected.

The similar operations are executed at each leveling check regions 14 in the exposure area 11 to check the leveling.

According to the aforementioned embodiment, the single focus check region 13 which is kept flat and horizontal to the surface of the wafer 10 is formed in each exposure area 11 that is used for one exposing operation of the stepper, and four leveling check regions 14 which are kept flat and horizontal to the surface of the wafer 10 is formed in the same exposure area 11. Thus, high accuracy of the focus check and the leveling check can be maintained, and size and shape of resist patterns formed by using the stepper can be kept stable resulting yields to increase.

Figure 5:
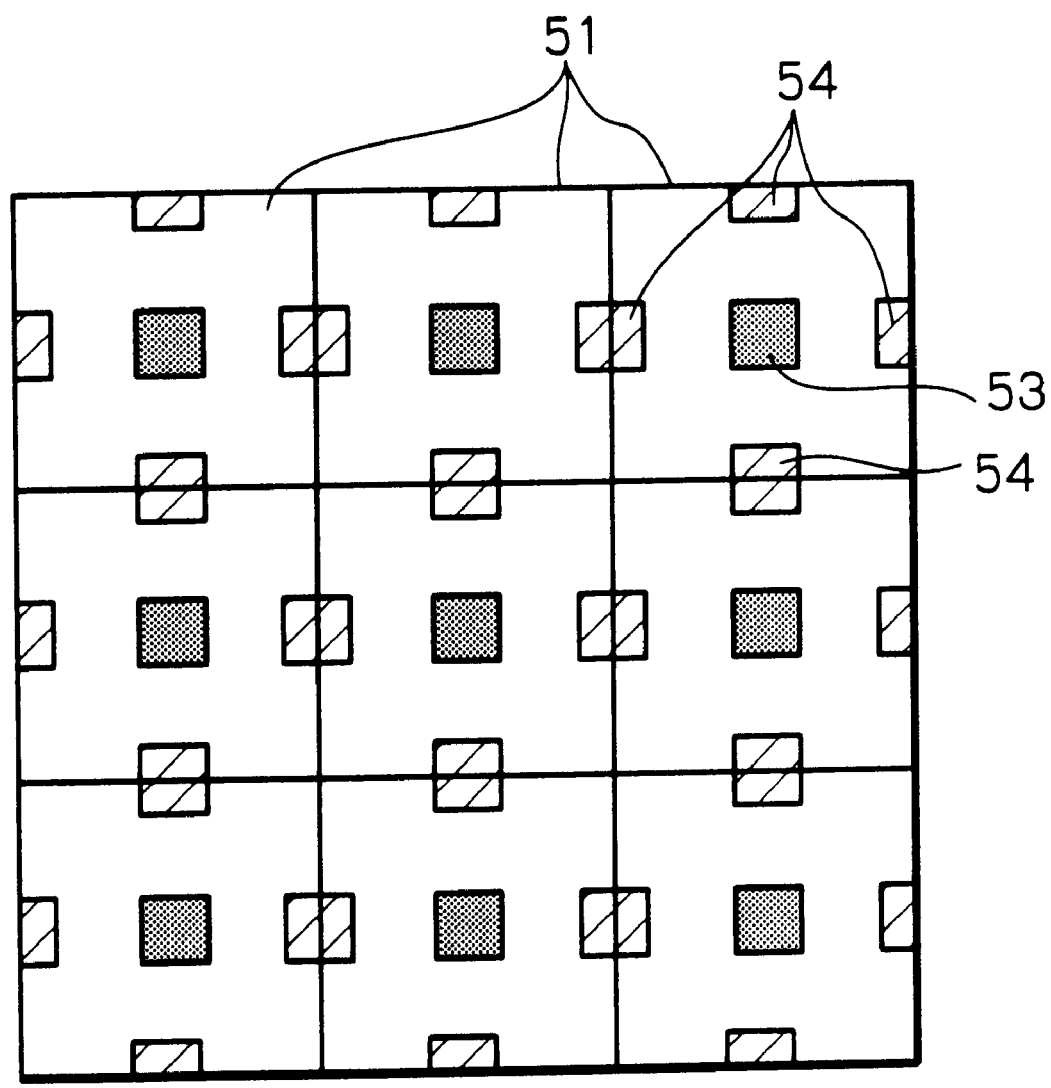
FIG. 5 shows a plane view illustrating another configuration of the leveling check region according to the present invention.

FIG. 5 illustrates another configuration of the leveling check region according to the present invention.

In the figure, reference numeral 51 denotes an exposure area used for one exposing operation of the stepper, 53 a single focus check region prepared at center portion of the exposure area 51, and 54 four leveling check regions prepared at four edges of the exposure area 51. Each leveling check region 54 is split in two across a boundary between the two adjacent exposure areas 51. The splitting ratio may be even or uneven with each other.

Since each leveling check region 54 is arranged to be split across a boundary between the two adjacent exposure areas 51, an area occupied by the leveling check regions 54 in one exposure area 51 reduces and thus effective use of the wafer can be attained.

Figure 6:
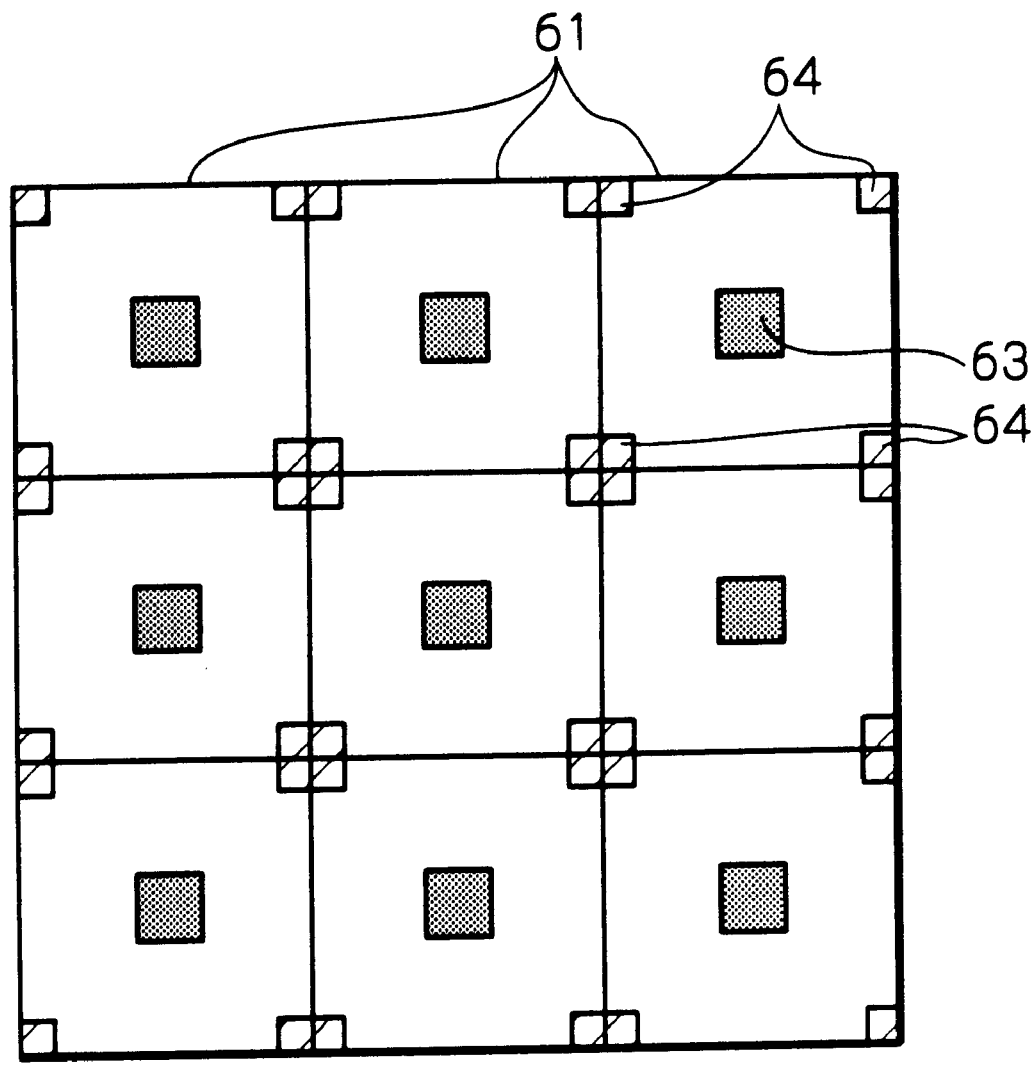
FIG. 6 shows a plane view illustrating a further configuration of the leveling check region according to the present invention.

FIG. 6 illustrates a further configuration of the leveling check region according to the present invention.

In the figure, reference numeral 61 denotes an exposure area used for one exposing operation of the stepper, 63 a single focus check region prepared at center portion of the exposure area 61, and 64 four leveling check regions prepared at four corners of the exposure area 61. Each leveling check region 64 is split in four across boundaries among the four adjacent exposure areas 61. The splitting ratio may be even or uneven with each other.

Since each leveling check region 64 is arranged to be split across boundaries among the four adjacent exposure areas 61, an area occupied by the leveling check regions 64 in one exposure area 61 further reduces and thus more effective use of the wafer can be attained.

Many widely different embodiments of the present invention may be constructed without departing from the spirit and scope of the present invention. It should be understood that the present invention is not limited to the specific embodiments described in the specification, except as defined in the appended claims.

What is claimed is:

1. A thin-film magnetic head wafer with a surface to be exposed by means of an optical stepper, said wafer comprising:

a plurality of thin-film magnetic head elements formed on said surface; and distance check regions each for checking focus and leveling of said optical stepper and having a flat plane that is horizontal to and level with said surface of said wafer, at least one of said distance check regions being formed on said surface within one exposure area of said optical stepper, in each distance check region no element is formed.

2. A thin-film magnetic head wafer with a surface to be exposed by means of an optical stepper, said wafer comprising:

a plurality of thin-film magnetic head elements formed on said surface; and distance check regions each for checking focus and leveling of said optical stepper and having a plane that is horizontal to said surface of said wafer and level with a plane of a thin-film layer or thin-film layers deposited on said surface of said wafer, at least one of said distance check regions being formed on said surface within one exposure area of said optical stepper, in each distance check region no element is formed.

* * * * *